US008105952B2

(12) United States Patent
Kihara et al.

(10) Patent No.: US 8,105,952 B2
(45) Date of Patent: Jan. 31, 2012

(54) METHOD OF FORMING A PATTERN

(75) Inventors: Naoko Kihara, Matsudo (JP); Hiroyuki Hieda, Yokohama (JP); Yoshiyuki Kamata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 796 days.

(21) Appl. No.: 12/222,916

(22) Filed: Aug. 19, 2008

(65) Prior Publication Data

US 2009/0078673 A1  Mar. 26, 2009

(30) Foreign Application Priority Data

Sep. 26, 2007 (JP) ................................. 2007-250180

(51) Int. Cl.
*H01L 21/302* (2006.01)
*H01L 21/461* (2006.01)

(52) U.S. Cl. ..................... 438/705; 438/706; 438/725

(58) Field of Classification Search ........................ None
See application file for complete search history.

(56) References Cited

U.S. PATENT DOCUMENTS

| 4,944,961 | A | 7/1990 | Lu et al. |
| 6,565,763 | B1 | 5/2003 | Asakawa et al. |
| 6,748,865 | B2 | 6/2004 | Sakurai et al. |
| 7,105,280 | B1 | 9/2006 | Deeman et al. |
| 7,347,953 | B2 | 3/2008 | Black et al. |
| 7,605,081 | B2 | 10/2009 | Yang et al. |
| 7,686,972 | B2 | 3/2010 | Hieda et al. |
| 7,826,176 | B2 * | 11/2010 | Shirotori et al. ............ 360/135 |
| 7,928,353 | B2 * | 4/2011 | Fujimoto et al. .......... 250/208.1 |
| 7,931,819 | B2 | 4/2011 | Kihara et al. |
| 2003/0222048 | A1 | 12/2003 | Asakawa et al. |
| 2004/0191577 | A1 | 9/2004 | Suwa et al. |
| 2004/0209123 | A1 | 10/2004 | Bajorek et al. |
| 2005/0069732 | A1 * | 3/2005 | Kamata et al. .......... 428/694 TC |
| 2005/0094298 | A1 * | 5/2005 | Sakurai et al. .................. 360/15 |
| 2005/0161427 | A1 | 7/2005 | Okawa et al. |

(Continued)

FOREIGN PATENT DOCUMENTS

CN         1815569 A        8/2006

(Continued)

OTHER PUBLICATIONS

Naito et al., "2.5-Inch Disk Patterned Media Prepared by an Artificially Assisted Self-Assembling Method" IEEE Transactions on Magnetics, vol. 38 No. 5, Sep. 2002. pp. 1949-1951.

(Continued)

*Primary Examiner* — Duy Deo
(74) *Attorney, Agent, or Firm* — Nixon & Vanderhye, P.C.

(57) ABSTRACT

A pattern forming method is provided, which includes forming, above a substrate, a layer of a diblock copolymer composition containing at least PS and PEO, subjecting the layer to phase separation to obtain a phase-separated layer, thereby forming an easy-to-etch region constituted by PS and having a cylindrical or lamellar configuration extending in a first direction, forming an imprinting resist layer on the phase-separated layer, subjecting the imprinting resist layer to imprinting to form, on the imprinting resist layer, an uneven pattern consisting of projections and recesses extending in a second direction intersecting with the first direction, selectively removing, from the imprinting resist layer, the recesses, thereby leaving only the projections and, at the same time, selectively removing the PS from the phase-separated layer to obtain an etching resistive pattern containing PEO, and etching the substrate using, as a mask, not only the projections but also the etching resistive pattern.

16 Claims, 12 Drawing Sheets

U.S. PATENT DOCUMENTS

| | | |
|---|---|---|
| 2005/0282038 A1 | 12/2005 | Yamamoto et al. |
| 2005/0284320 A1 | 12/2005 | Sakuarai et al. |
| 2006/0012904 A1 | 1/2006 | Naruse et al. |
| 2006/0176606 A1 | 8/2006 | Soeno et al. |
| 2007/0065588 A1 | 3/2007 | Kihara et al. |
| 2007/0070548 A1 | 3/2007 | Shirotori et al. |
| 2007/0090087 A1 | 4/2007 | Shirotori et al. |
| 2007/0207263 A1 | 9/2007 | Hieda |
| 2007/0211592 A1* | 9/2007 | Sakurai et al. ............. 369/47.49 |
| 2007/0281220 A1 | 12/2007 | Sandhu et al. |
| 2007/0289943 A1 | 12/2007 | Lu et al. |
| 2008/0038467 A1 | 2/2008 | Jagannathan et al. |
| 2008/0041818 A1 | 2/2008 | Kihara |
| 2008/0193658 A1 | 8/2008 | Millward |
| 2009/0034115 A1 | 2/2009 | Soeno et al. |
| 2009/0078673 A1 | 3/2009 | Kihara et al. |
| 2009/0130380 A1 | 5/2009 | Asakawa et al. |

FOREIGN PATENT DOCUMENTS

| | | |
|---|---|---|
| JP | 60-211939 | 10/1985 |
| JP | 62-161148 | 7/1987 |
| JP | 2-90172 | 3/1990 |
| JP | 2001-044794 | 2/2001 |
| JP | 2001-151834 | 6/2001 |
| JP | 2003-155365 | 5/2003 |
| JP | 2003-332313 | 11/2003 |
| JP | 2004-265474 | 9/2004 |
| JP | 2004-295989 | 10/2004 |
| JP | 2004-342226 | 12/2004 |
| JP | 2005-023358 | 1/2005 |
| JP | 2005-041931 | 2/2005 |
| JP | 2005-056547 | 3/2005 |
| JP | 2006-012216 | 1/2006 |
| JP | 2006-031848 | 2/2006 |
| JP | 2006-048751 | 2/2006 |
| JP | 2006-216171 | 8/2006 |
| JP | 2006-334693 | 12/2006 |
| JP | 2007-125699 | 5/2007 |

OTHER PUBLICATIONS

U.S. Appl. No. 11/705,037 of Hieda, filed Feb. 12, 2007.

U.S. Appl. No. 11/727,158 of Kihara, filed Mar. 23, 2007.

Office Action in Chinese Patent Application No. 200810215456.4, dated Jun. 9, 2010, and English-language translation.

Katsuyuki Naito; "Chaos 15 (4)" Dec. 2005, pp. 047507-1 to 047507-7.

Jian Wang et al.; "Direct nanoimprint of submicron organic light-emitting structures"; Applied Physics Letters; vol. 75, No. 18; Nov. 1, 1999; pp. 2767-2769.

Freer et al., *Oriented Mesoporous Organosilicate Thin Films*, Nano Letters, 2005, vol. 5, No. 10, pp. 2014-2018.

Sundström et al., *Patterning ~20 nm half-pitch lines on silicon using a self-assembled organosilicate etch mask*, Applied Physics Letters, 88, 243107 (2006), 3 pages.

Mansky et al., *Nanolithographic templates from diblock copolymer thin films*, Appl. Phys. Lett. 68 (18); Apr. 29, 1996, pp. 2586-2588.

Park et al., *Block Copolymer Lithography: Periodic Arrays of ~$10^{11}$ Holes in 1 Square Centimeter*, Science, vol. 276, May 30, 1997, pp. 1401-1404.

Segalman et al., *Controlling the Long Range Ordering of Block Copolymer Micelle Films*, Bulletin of the American Physical Society, 45, 559, 1 page, Mar. 2000.

Trawick et al., *Alignment of Block Copolymer Spherical Microdomains Using Substrate Features*, Bulletin of the American Physical Society, 46, 1000, 1 page, Mar. 2001.

Park et al., *Large area dense nanoscale patterning of arbitrary surfaces*, Applied Physics Letters, vol. 79, No. 2, Jul. 9, 2001, pp. 257-259.

Dario Pisignano et al.; "Room-Temperature Nanoimprint Lithography of Non-thermoplastic Organic Films"; Advanced Materials; No. 6; Mar. 18, 2004; pp. 525-529.

Atsushi Yokoo et al.; "Organic Photonic Crystal Band Edge Laser Fabricated by Direct Nanoprinting"; Japanese Journal of Applied Physics, vol. 43, No. 6B; 2004; pp. 4009-4011.

Hattori et al.; "Fabrication of Discrete Track Perpendicular Media for High Recording Density"; IEEE Transactions on Magnetics, vol. 40, No. 41 Jul. 2004; pp. 2510-2515.

* cited by examiner

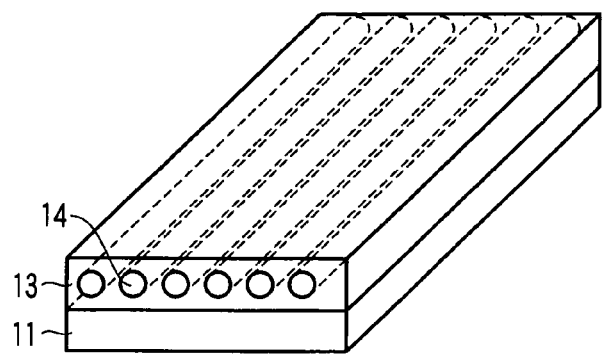
F I G. 3
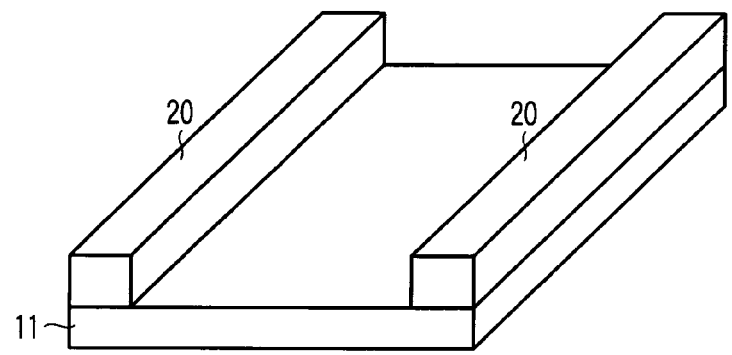
F I G. 4
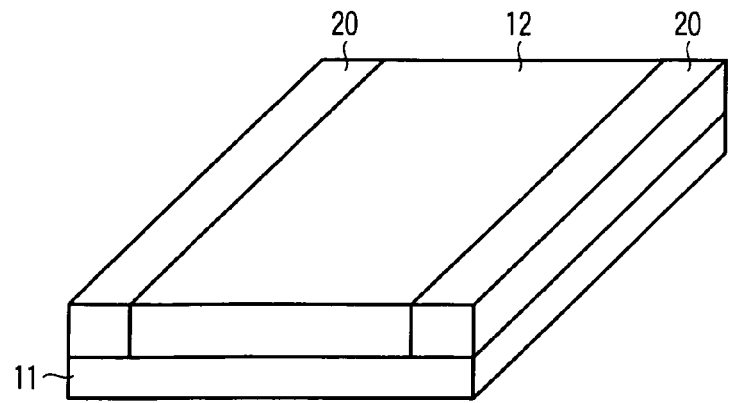
F I G. 5

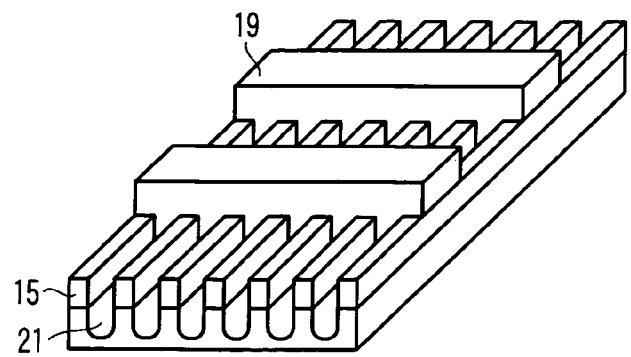
F I G. 11
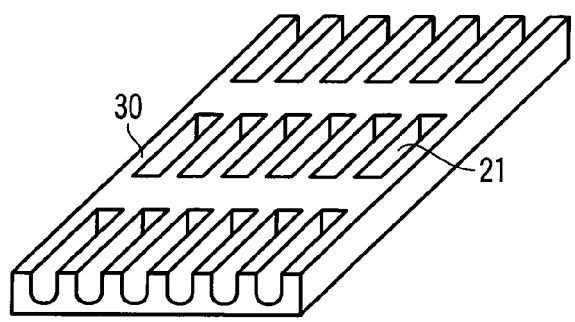
F I G. 12
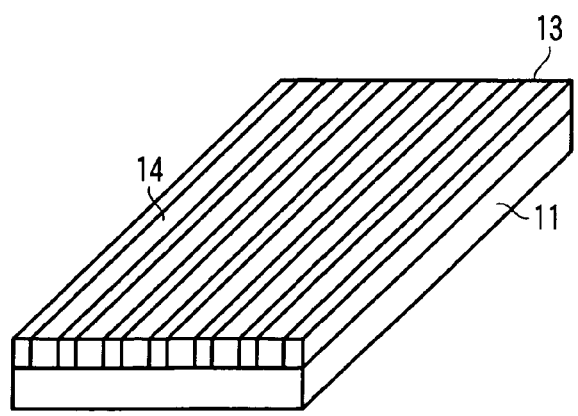
F I G. 13

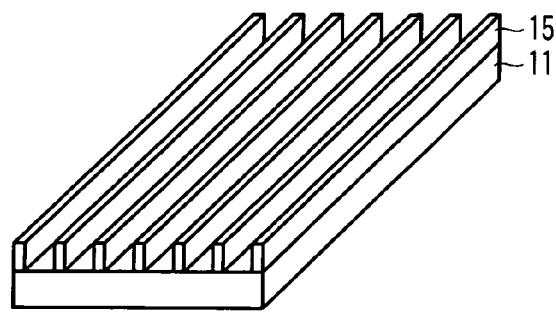
F I G. 14
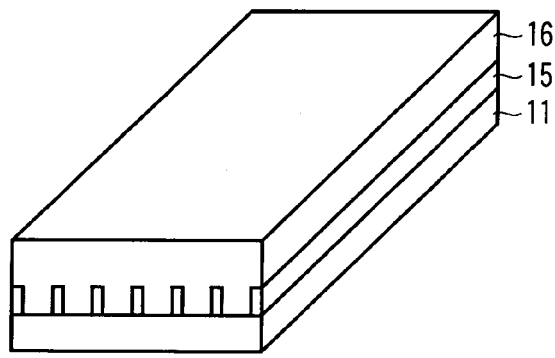
F I G. 15
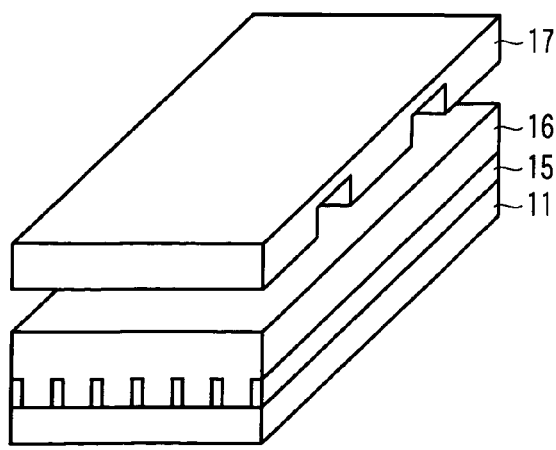
F I G. 16

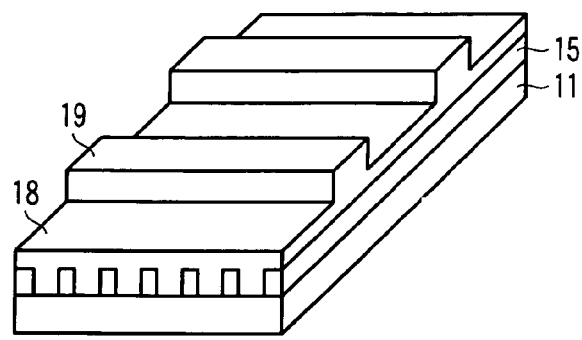
F I G. 17
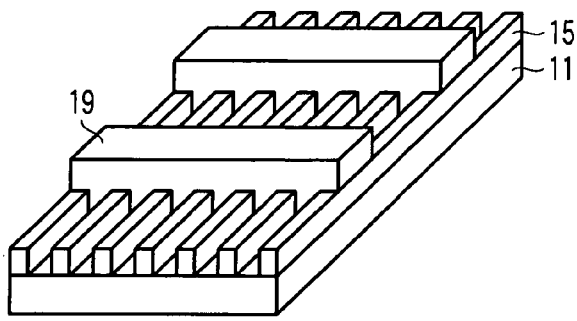
F I G. 18
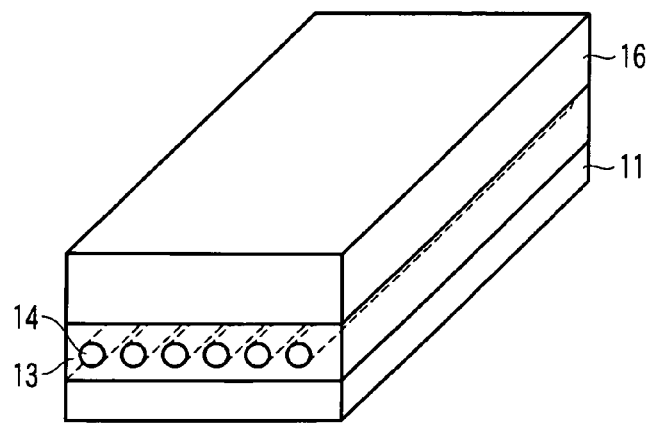
F I G. 19

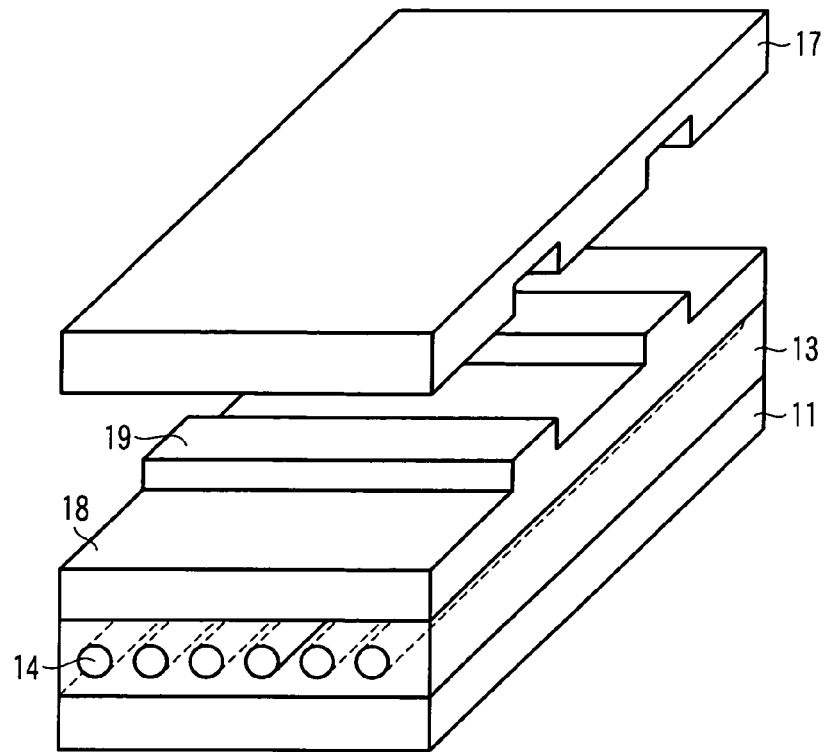
F I G. 20
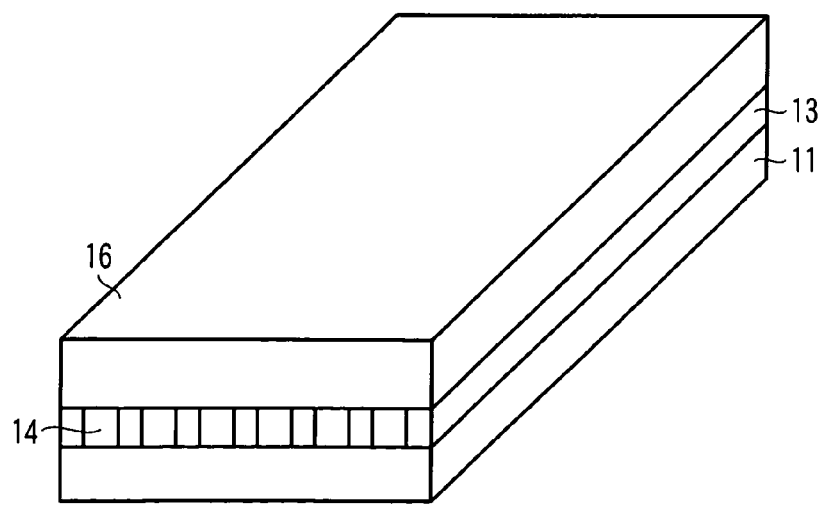
F I G. 21

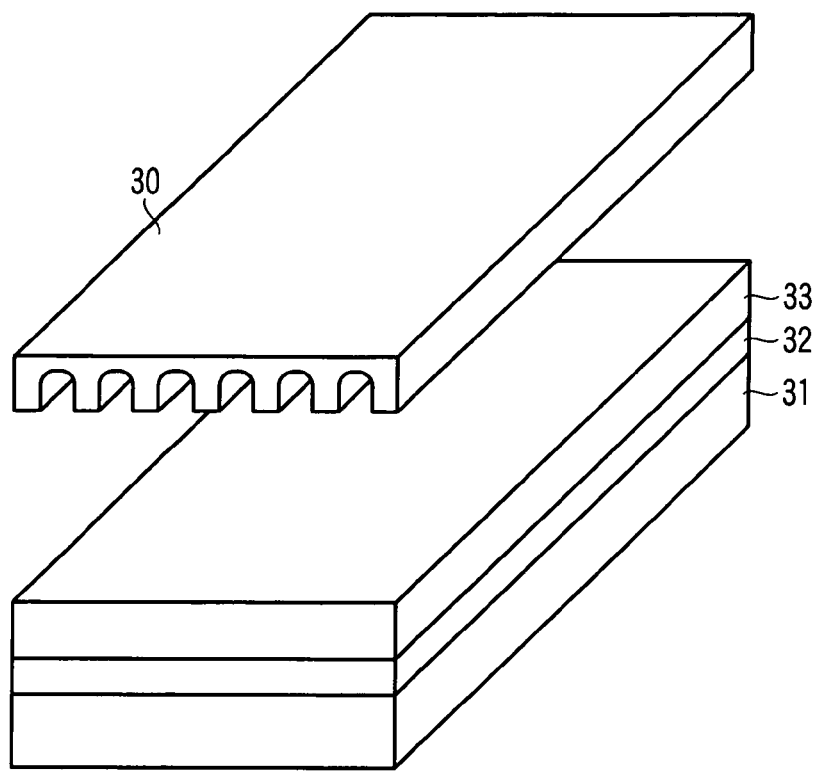
F I G. 24
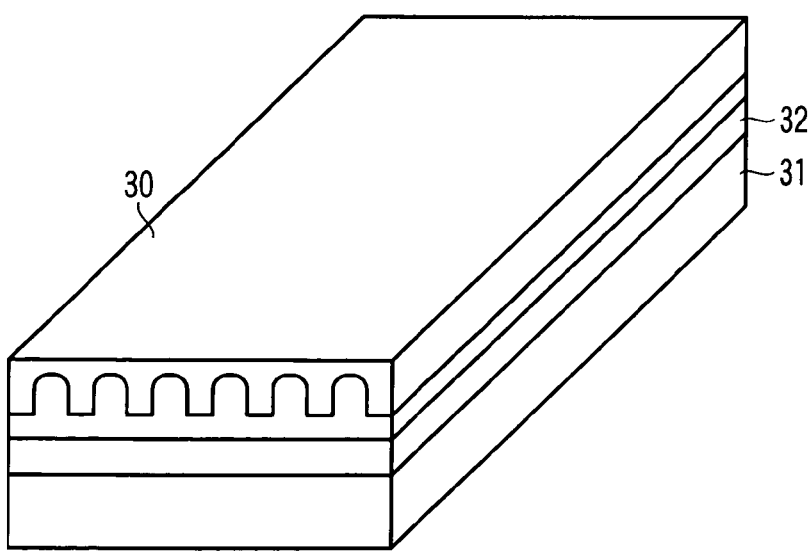
F I G. 25

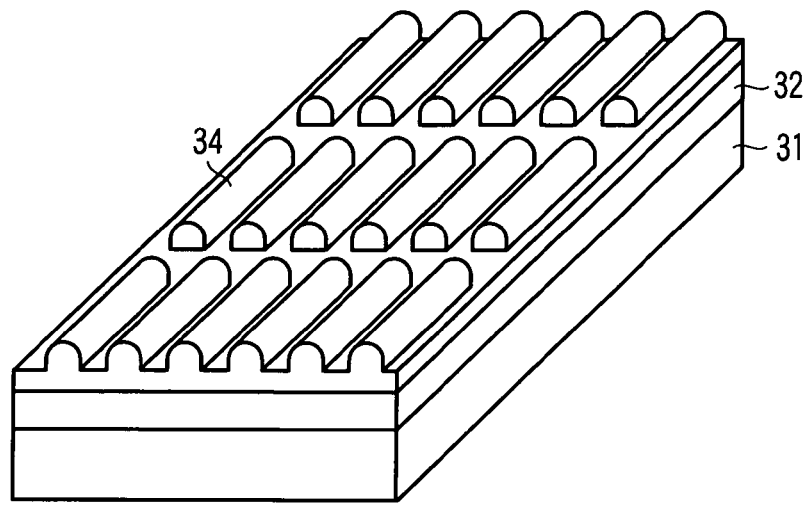
F I G. 26
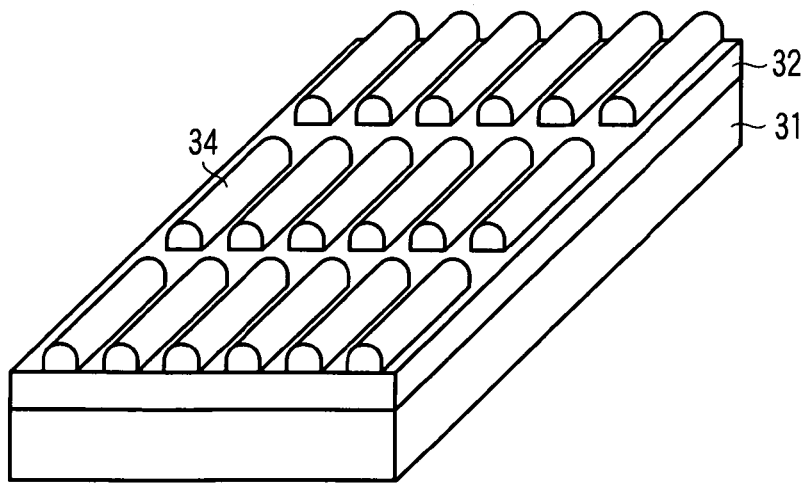
F I G. 27

METHOD OF FORMING A PATTERN

CROSS-REFERENCE TO RELATED APPLICATIONS

This application is based upon and claims the benefit of priority from prior Japanese Patent Application No. 2007-250180, filed Sep. 26, 2007, the entire contents of which are incorporated herein by reference.

BACKGROUND OF THE INVENTION

1. Field of the Invention

This invention relates to a method for forming a pattern, to an imprint mold to be manufactured by this pattern forming method, and to a method of manufacturing a magnetic recording medium wherein this imprint mold is employed.

2. Description of the Related Art

Since the invention of the magnetic recording medium, the recording density thereof has continued to increase year by year and, even today, this trend continues.

Although patterned media may be effective means for realizing a recording density of as high as the tera-bit class, the size of the cell required for achieving such a high recording density is limited to as small as 30-20 nm or less. Such a fine microfabrication of a cell can be made possible by drawing a fine pattern by an electron beam, though this takes a long time. Therefore, the media worked in this manner would become very high in price.

It has been proposed to overcome this problem by employing a method wherein the patterned media are manufactured by taking advantage of the phase separation of a diblock copolymer, as described in IEEE Trans. Magn. Vol. 38, pp. 1949, K. Naito et al.; and in JP-A 2004-342226 (KOKAI). More specifically, according to this method, the diblock copolymer, consisting of polystyrene and polymethylene methacrylate, for example is subjected to phase separation to form a dot pattern, which is subsequently transferred onto a magnetic film to create magnetic dots to be used as recording cells. Owing to this phase separation of the diblock copolymer, it is possible to form a circular dot pattern which is arranged in the closest type of packing.

In the case of the magnetic recording apparatus having patterned media mounted thereon, there is the possibility that two or more recording cells may be erroneously wrought or read out en bloc by the recording head thereof. If it is possible to optimize the conditions such as the array of magnetic dots and the width of track in conformity with the recording head, it may be possible to obviate such a possibility. It is proposed in JP-A 2004-265474 (KOKAI) to form a dot pattern through the phase separation of a diblock copolymer in such a manner as to create the configuration of a bit in conformity with the locus of the configuration of the recording head. However, even with the method of forming a dot pattern through the phase separation of a diblock copolymer, it has been difficult to optimize the conditions such as the array of magnetic dots and the width of track in conformity with the configuration of the recording head.

BRIEF SUMMARY OF THE INVENTION

A pattern forming method according to one aspect of the present invention comprises:

forming a layer comprising a composition above a substrate, the composition containing a diblock copolymer which can be phase-separated into a first phase and a second phase exhibiting higher etching resistance than the first phase, the first phase containing a first component and the second phase containing a second component;

subjecting the diblock copolymer to phase separation to obtain a phase-separated layer, thereby forming an easy-to-etch region constituted by the first component and having a cylindrical or lamellar configuration extending in a first direction;

forming an imprinting resist layer on the phase-separated layer;

subjecting the imprinting resist layer to imprinting work using a mask pattern to form, on the imprinting resist layer, an uneven pattern extending in a second direction intersecting with the first direction and including projections and recesses;

selectively removing, from the imprinting resist layer, the resist left remaining on a bottom of each of the recesses of an uneven pattern, thereby leaving only the resist constituting the projections and, at the same time, selectively removing the first component from the phase-separated layer to obtain an etching resistive pattern containing the second component; and etching the substrate using, as a mask, not only the projections of the imprinting resist layer but also the etching resistive pattern containing the second component.

A pattern forming method according to another aspect of the present invention comprises:

forming a layer comprising a composition above a substrate, the composition containing a diblock copolymer which can be phase-separated into a first phase and a second phase exhibiting higher etching resistance than the first phase, the first phase containing a first component and the second phase containing a second component;

subjecting the diblock copolymer to phase separation to obtain a phase-separated layer, thereby forming an easy-to-etch region constituted by the first component and having a cylindrical or lamellar configuration extending in a first direction;

removing the first component from the phase-separated layer to form an etching resistive pattern extending in the first direction and containing the second component;

forming a imprinting resist layer on the etching resistive pattern;

subjecting the imprinting resist layer to imprinting work using a mask pattern to form, on the imprinting resist layer, an uneven pattern extending in a second direction intersecting with the first direction and including projections and recesses;

selectively removing, from the imprinting resist layer, the resist left remaining on a bottom of each of the recesses of an uneven pattern, thereby leaving only the resist constituting the projections; and etching the substrate using, as a mask, not only the etching resistive pattern containing the second component but also the projections of the imprinting resist layer.

An imprint mold according to a one aspect of the present invention comprises a substrate which is worked by the aforementioned pattern-forming method.

A method for manufacturing a magnetic recording medium according to a one aspect of the present invention comprises:

forming a magnetic film above a medium substrate;

forming a resist layer above the magnetic film;

performing imprinting on the resist layer using the imprint mold above mentioned to create resist pattern constituted of projections; and etching the magnetic film with the resist pattern as a mask.

BRIEF DESCRIPTION OF THE SEVERAL VIEWS OF THE DRAWING

FIG. 3 is a perspective view representing the next step to the step shown in FIG. 2;

FIG. 4 is a perspective view representing one step in the manufacturing method of an imprint mold according to another embodiment;

FIG. 5 is a perspective view representing the next step to the step shown in FIG. 4;

FIG. 11 is a perspective view representing the next step to the step shown in FIG. 10;

FIG. 12 is a perspective view representing the next step to the step shown in FIG. 11;

FIG. 13 is a perspective view representing one step in the manufacturing method of an imprint mold according to a further embodiment;

FIG. 14 is a perspective view representing the next step to the step shown in FIG. 13;

FIG. 15 is a perspective view representing the next step to the step shown in FIG. 14;

FIG. 16 is a perspective view representing the next step to the step shown in FIG. 15;

FIG. 17 is a perspective view representing the next step to the step shown in FIG. 16;

FIG. 18 is a perspective view representing the next step to the step shown in FIG. 17;

FIG. 19 is a perspective view representing one step in the manufacturing method of an imprint mold according to a further embodiment;

FIG. 20 is a perspective view representing the next step to the step shown in FIG. 19;

FIG. 21 is a perspective view representing one step in the manufacturing method of an imprint mold according to a further embodiment;

FIG. 24 is a perspective view representing one step in the manufacturing method of a magnetic recording medium according to one embodiment;

FIG. 25 is a perspective view representing the next step to the step shown in FIG. 24;

FIG. 26 is a perspective view representing the next step to the step shown in FIG. 25;

FIG. 27 is a perspective view representing the next step to the step shown in FIG. 26;

DETAILED DESCRIPTION OF THE INVENTION

Next, embodiments will be explained with reference to the drawings.

Figure 1A:
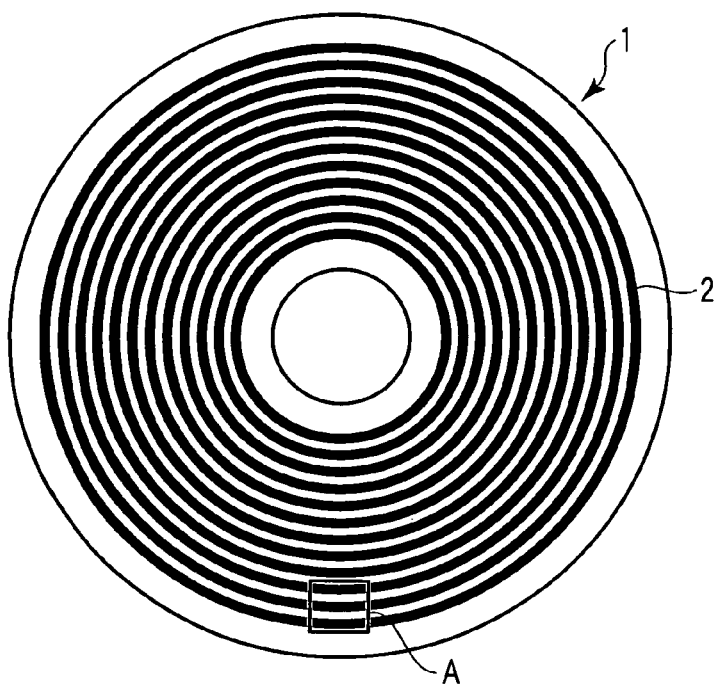
FIG. 1A is a plan view of a magnetic recording medium according to one embodiment.
Figure 1B:
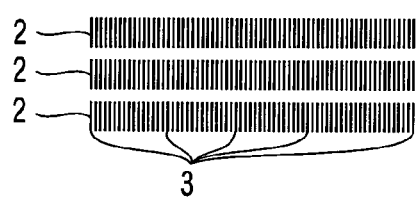
FIG. 1B is an enlarged plan view of the region "A" of FIG. 1A.

As shown in FIG. 1A, tracks 2 arranged as a pattern of concentric circles are formed on a magnetic recording medium 1. As shown in FIG. 1B, these tracks 2 are respectively constituted by a large number of magnetic cells 3 which are aligned parallel with each other and in the same pitch irrespective of whether these magnetic cells 3 are located as an inner track or an outer track. The imprint mold according to one embodiment is useful in the manufacture of such a magnetic recording medium and can be manufactured according to a pattern-forming method according to another embodiment.

Figure 2:
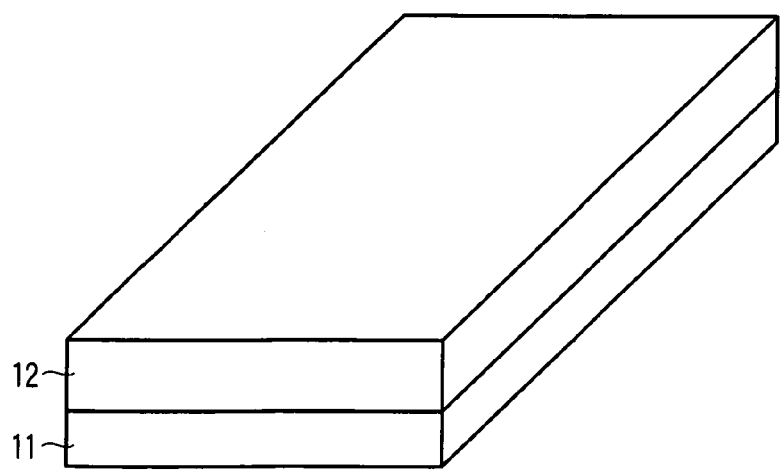
FIG. 2 is a perspective view representing one step in the manufacturing method of an imprint mold according to one embodiment.

Next, the method for forming a pattern according to one embodiment will be explained with reference to FIGS. 2 to 12. First of all, as shown in FIG. 2, a layer 12 containing a diblock copolymer is formed on the substrate 11. As for the substrate 11, there is no particular limitation and hence it is possible to employ, for example, a plastic substrate, a glass substrate, a silicon substrate, etc. Any kind of thin film, such as a magnetic film, a semiconductor film, an insulating film, a conductive film, etc. can be formed on the substrate 11. Namely, by the method for forming a pattern according to one embodiment, the substrate 11 may be directly worked. Alternatively, by the method for forming a pattern according to one embodiment, a pattern may be formed on a thin film deposited in advance on the substrate 11.

The diblock copolymer-containing composition layer 12 is separated into two kinds of phases differing in etching resistance. As for features of the component (first component) constituting a first phase that has been phase-separated, there is no particular limitation as long as the etching resistance thereof is lower than that of the component (second component) constituting the second phase and hence there is no particular limitation with respect to the kind of constituent component as well as with respect to the composition and molecular weight of the diblock copolymer. As examples of the diblock copolymer containing the first component and the second component, they include polystyrene-polymethylmethacrylate (PS-PMMA), polystyrene-poly(ethylene-alt-propylene) (PS-PEP), polystyrene-polybutadiene (PS-PBD), polystyrene-polyisoprene (PS-PI), polystyrene-polyvinylmethyl ether (PS-PVME), polystyrene-polyethylene oxide (PS-PEO), etc.

Further, as examples of the diblock copolymer exhibiting high cylindrical orientation, they include diblock copolymers comprising liquid-crystallized mesogen group-substituted polyacrylate which is copolymerized with, for example, polyethylene oxide, polypropylene oxide or polybutylene oxide.

The pitch of the phase separation to be obtained can be controlled by adjusting the total molecular weight of the diblock copolymer, or the difference in molecular weight or polarity of each of the polymer components.

As the method of creating a difference in etching resistance between the first phase and the second phase of the phase-separated structure, it is preferable to employ a method wherein a silicon-containing component exhibiting high oxygen-etching resistance is incorporated into the component of the second phase. For example, derivatives such as silsesquioxane can be effectively employed as such a silicon-containing component (for example, Nano Letters (2004) 273, Appl. Phys. Lett. 88, 243107 (2006)). Further, organic or inorganic silicon-containing compounds such as silicates represented by the following general formula (1), hydrogen siloxane represented by the following general formula (2), methyl siloxane represented by the following general formula (3) and methyl siloxane represented by the following general formula (4) can be preferably employed. Furthermore, hydrogen silsesquioxane represented by the following general formula (5)

and methyl silsesquioxane represented by the following general formula (6) can be also employed as such a silicon-containing component.

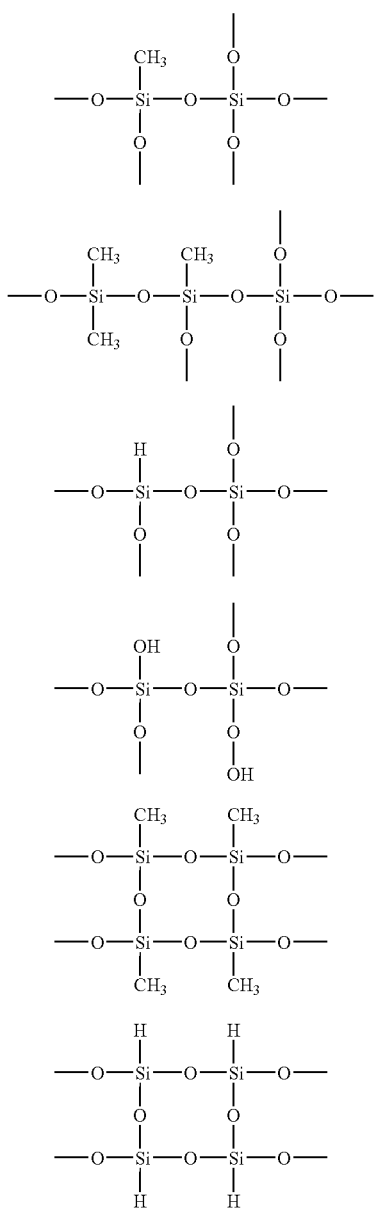

The diblock copolymer-containing composition layer 12 can be subjected to annealing treatment by heating or solvent atmosphere to obtain a diblock copolymer-containing composition layer 13 that has been phase-separated as shown in FIG. 3. Due to this phase separation, the first polymer component is turned to form an easy-to-etch region 14 having a cylindrical configuration. The longitudinal direction of this cylindrical easy-to-etch region 14 is defined herein as a first direction.

Figure 6:
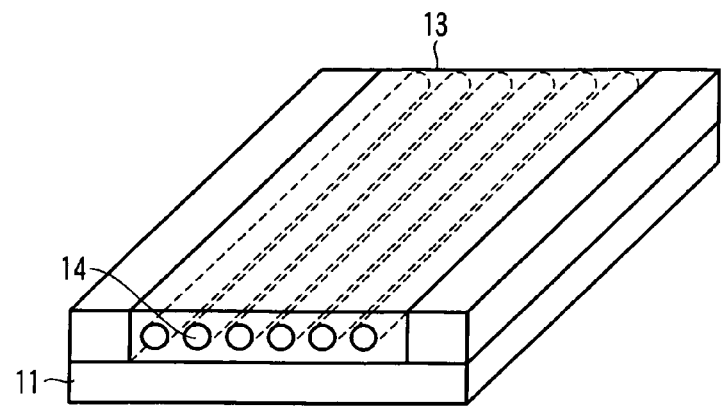
FIG. 6 is a perspective view representing the next step to the step shown in FIG. 5.

The diblock copolymer-containing composition layer 13 thus phase-separated should preferably be configured such that the direction of each of the cylinders constituting the easy-to-etch region 14 is uniformly aligned in a predetermined direction. This can be achieved, for example, by preliminarily forming a pair of guides 20 on the opposite fringe portions of substrate 11 as shown in FIG. 4. In this case, the diblock copolymer-containing composition layer 12 is formed between the guides 20 as shown in FIG. 5, thereby making it possible to create the phase-separated diblock copolymer-containing composition layer 13 as shown in FIG. 6 (for example, T. Yamaguchi, et al., J. Photopolym. Sci. Technol., 18 (2005) pp. 421).

Alternatively, the phase-separated diblock copolymer-containing composition layer 13 can be created by applying a shearing stress to the diblock copolymer-containing composition layer 12 along the surface thereof (D. E. Angelescu, et al., Adv. Mater., 16 (2004) pp. 1739). When a phase-separated template to be manufactured is used in the formation of a magnetic medium, the direction of the guide or the shearing stress should preferably follow the locus of the arm of the head.

Figure 7:
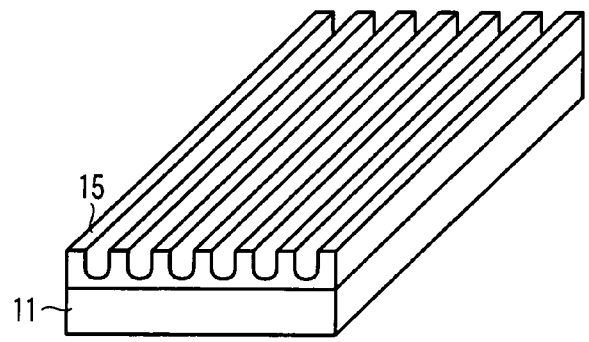
FIG. 7 is a perspective view representing the next step to the step shown in FIG. 6.

Next, the easy-to-etch region 14 consisting of the component of the first phase is removed to form an etching resistive pattern 15 comprising the component of the second phase as shown in FIG. 7. The easy-to-etch region 14 can be removed by plasma etching or heat treatment.

Figure 8:
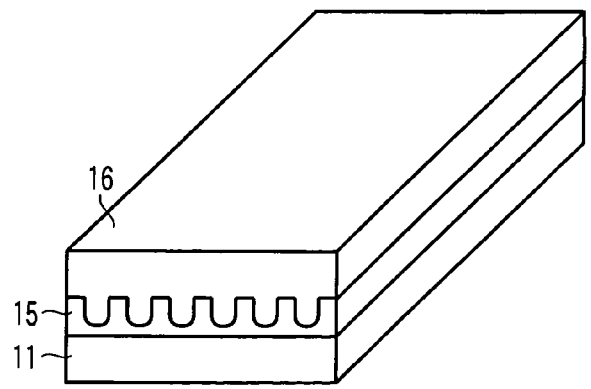
FIG. 8 is a perspective view representing the next step to the step shown in FIG. 7.

Further, as shown in FIG. 8, an imprinting resist layer 16 (hereinafter referred to simply as an imprinting resist layer 16) as an uneven pattern is formed on the etching resistive pattern 15. On this occasion, in order to prevent the deterioration in shape of the pattern that may be caused by mixing, it is preferable to take measures to decrease the mutual solubility between the imprinting resist layer 16 and the etching resistive pattern 15. More specifically, this can be achieved by the insolubilization of the components of the diblock copolymer or additive components through the three-dimensional crosslinking thereof. Alternatively, the resist for imprinting may be selected from those differing in polarity from that of the components of the diblock copolymer.

Figure 9:
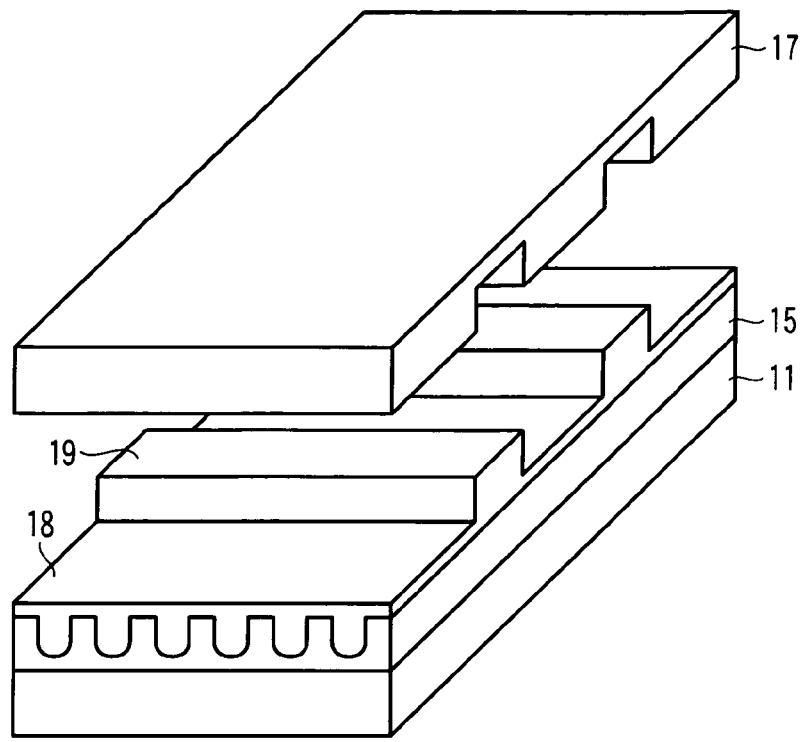
FIG. 9 is a perspective view representing the next step to the step shown in FIG. 8.

Then, as shown in FIG. 9, a mask pattern 17 is placed on the imprinting resist layer 16. This mask pattern 17 is provided with an uneven pattern having projections and recesses each extending in a second direction intersecting with the aforementioned first direction. This uneven pattern of the mask pattern 17 can be created by, for example, electron beam lithography. Using this mask pattern 17 having a prescribed uneven pattern, the imprinting of the imprinting resist layer 16 is performed.

As a result, an uneven pattern consisting of projections 19 and recesses 18 is formed on the imprinting resist layer 16 as shown in FIG. 9. This uneven pattern is featured in that the projections and recesses thereof are elongated in the second direction intersecting with the aforementioned first direction. The angle of intersection between the first direction and the second direction may be optionally adjusted depending on the end-use thereof.

Figure 10:
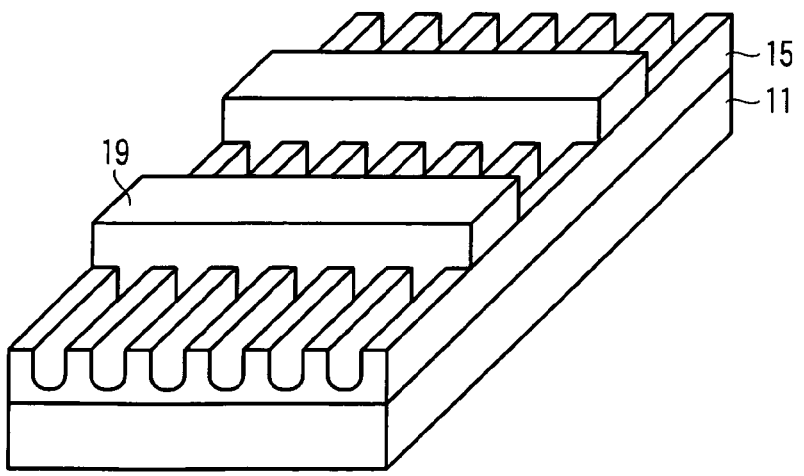
FIG. 10 is a perspective view representing the next step to the step shown in FIG. 9.

The recesses 18 of the uneven pattern formed on the imprinting resist layer 16 are then removed by plasma etching, etc., which can be selected depending on the kind of imprinting resist, thereby enabling to expose the etching resistive pattern 15 containing the component of the second phase as shown in FIG. 10. As a result, the projections 19 of the uneven pattern formed on the imprinting resist layer 16 and elongated in the second direction are left remaining on the etching resistive pattern 15 elongated in the first direction as shown in FIG. 10.

Then, using the etching resistive pattern 15 comprising the component of the second phase and the projections 19 of the imprinting resist layer 16 as masks, the substrate 11 is subjected to etching work to form trenches 21 as shown in FIG. 11. Finally, the etching resistive pattern 15 comprising the component of the second phase and the projections 19 of the imprinting resist layer 16 are removed to form an imprint mold 30 having a projection forming a grid-like pattern and surrounding the rectangular trenches 21 as shown in FIG. 12.

Next, one example of forming a grid-like pattern on the silicon substrate using a composition consisting of a mixture comprising, as a diblock copolymer, polystyrene-polyethylene oxide (PS-PEO) and SOG (Spin-on-glass) according to the aforementioned method will be explained.

As shown in FIG. 2, a solution consisting of a mixture comprising polystyrene-polyethylene oxide (PS-PEO) and SOG is coated on a silicon substrate employed as the substrate 11 to form a diblock copolymer-containing composition layer 12 consisting of a mixture comprising PS-PEO and SOG. The component of the first phase is PS and the component of the second phase is PEO. Due to the incorporation of SOG constituting a silicon-containing component into the PS-PEO, the oxygen etching resistance of the component of the second phase is made higher than that of PS constituting the component of the first phase.

The diblock copolymer-containing composition layer 12 is then subjected to annealing treatment to obtain a phase-separated diblock copolymer composition layer which has been phase-separated. As the method of annealing to be employed on this occasion, either a method of heating the layer 12 or a method of exposing the layer 12 to a solvent atmosphere may be employed. As a result of this annealing treatment, the easy-to-etch region 14 constituted by the PS representing the component of the first phase is formed as a cylindrical pattern as shown in FIG. 3, thereby obtaining the phase-separated diblock copolymer-containing composition layer 13. The longitudinal direction of the easy-to-etch region 14 is referred to herein as the first direction.

This easy-to-etch region 14 is then removed to obtain the etching resistive pattern 15 containing the component of the second phase as shown in FIG. 7. This easy-to-etch region 14 can be removed by heating to a temperature of 300° C. or more for example. Alternatively, this easy-to-etch region 14 may be removed by subjecting the easy-to-etch region 14 to oxygen plasma treatment.

Then, the imprinting resist layer 16 is formed on the etching resistive pattern 15 as shown in FIG. 8. Then, the mask pattern 17 provided with a prescribed uneven pattern is prepared and placed on the imprinting resist layer 16 as shown in FIG. 9. Thereafter, the mask pattern 17 is compressed using a pressing apparatus to form an uneven pattern consisting of projections 19 and recesses 18 on the imprinting resist layer 16.

The pattern to be formed on the imprinting resist layer 16 is featured in that the projections 19 and recesses 18 thereof are elongated in the second direction intersecting with the aforementioned first direction. The angle of intersection between the first direction and the second direction may be set within the range of about 60° to 90° depending on the configuration of the recording head for instance.

Subsequently, the imprinting resist layer 16 is subjected to oxygen etching to remove the recesses 18 of the uneven pattern of imprinting resist layer 16, thus leaving only the projects 19. As a result, an etching mask having a grid-like pattern constituted by an etching resistive pattern 15 containing the component of the second phase and also by the projections 19 of the imprinting resist layer is formed as shown in FIG. 10.

Then, etching is performed with the grid-like pattern being used as a mask, thereby performing the working of the substrate 11 as shown in FIG. 11. As the etching gas to be employed on this occasion, it is preferable to select from those which are capable of securing a large selectivity ratio in etching rate between the mask and the substrate. In the case where the substrate 11 is formed of a silicon substrate, $SF_6$ gas, for example, may be preferably employed. Further, it is also possible to employ a mixed gas comprising $SF_6$ gas and oxygen, nitrogen or chlorine-base gas. However, the etching gas useful in this case is not limited to these gases.

Subsequent to the etching of the substrate 11, the etching resistive pattern 15 is removed by wet etching using a solvent, hydrofluoric acid, etc. or by dry etching using a halogen-based gas to obtain a silicon substrate having a pattern consisting of rectangular recesses as shown in FIG. 12. As the aspect ratio in length and width of each of the rectangular recesses, the aspect ratio can be determined by the pitch of phase separation of the diblock copolymer composition and by the width of the trench in the pattern of the imprint mold that has been prepared in advance, so that it is possible to form a pattern of recesses each having an optional aspect ratio by suitably selecting the composition of the diblock copolymer as well as by suitably selecting the design of mask pattern 17 as shown in FIG. 9.

The easy-to-etch region 14 which is constituted by the component of the phase-separated first phase may be lamellar. Namely, it may be a state wherein the component of the first phase and the component of the second phase are phase-separated lamellarly. It is especially preferable that the component of the first phase and the component of the second phase are phase-separated from each other in a direction perpendicular to the substrate.

Next, another example where the aforementioned phase separation is utilized will be explained with reference to FIGS. 13 to 18. It is also possible to manufacture the imprint mold by repeating the same procedures as employed in the aforementioned cylindrical phase separation except that the diblock copolymer composition employed in this case is formed of a composition which can be phase-separated lamellarly. For example, it is possible to realize the lamellar phase separation by suitably modifying the composition ratio of the polymer component of the diblock copolymer or the mixing ratio of the silicon compound contained in the diblock copolymer composition.

First of all, as shown in FIG. 2, a diblock copolymer-containing composition layer 12 is formed on the substrate 11. The phase separation in a direction perpendicular to the plane of the substrate can be reliably achieved by depositing a prescribed random copolymer composition thin film on the substrate 11 prior to the formation of diblock copolymer-containing composition layer 12. More specifically, a random copolymer composition thin film containing the same kinds of the first and second components as contained in the diblock copolymer to be employed is deposited in advance. Further, when a guide is formed for promoting the alignment of the phase separation structure, it is preferable to employ a material exhibiting affinity to one of the constituent members of the diblock copolymer.

The diblock copolymer-containing composition layer 12 is then subjected to annealing treatment by heating or solvent atmosphere to obtain a diblock copolymer-containing composition layer 13 that has been phase-separated as shown in FIG. 13. Due to this phase separation, the first polymer component is turned to form an easy-to-etch region 14 having a lamellar configuration. As in the case of the aforementioned cylindrical configuration, the longitudinal direction of this lamellar easy-to-etch region 14 is defined herein as a first direction.

This easy-to-etch region 14 constituted by the component of the first phase is then removed to obtain the etching resistive pattern 15 containing the component of the second phase as shown in FIG. 14. Then, the imprinting resist layer 16 is formed on the etching resistive pattern 15 as shown in FIG. 15. Then, using the mask pattern 17, the imprinting of the imprinting resist layer 16 is performed as shown in FIG. 16 to form an uneven pattern consisting of projections 19 and recesses 18 on the imprinting resist layer 16 as shown in FIG. 17.

The recesses 18 of the uneven pattern formed on the imprinting resist layer 16 are then removed by etching, thereby enabling to expose the etching resistive pattern 15 containing the component of the second phase as shown in FIG. 18.

Then, using the etching resistive pattern 15 comprising the component of the second phase and the projections 19 of the imprinting resist layer 16 as masks, the substrate 11 is worked as shown in FIG. 11. Finally, the etching resistive pattern 15 is removed to form an imprint mold 30 as shown in FIG. 12.

The easy-to-etch region 14 created from the phase separation need not necessarily be removed from the phase-separated diblock copolymer layer 13 prior to the formation of the imprinting resist layer 16.

As shown in FIG. 19, the imprinting resist layer 16 may be provided on the diblock copolymer layer 13 that has been phase-separated due to the creation of cylindrical easy-to-etch region 14. Then, using the mask pattern 17 as shown in FIG. 20, an uneven pattern consisting of projections 19 and recesses 18 is formed on the imprinting resist layer 16.

The residual resist left remaining on the bottom of the recesses of the uneven pattern formed on the imprinting resist layer 16 is removed and then the easy-to-etch region 14 constituted by the component of the first phase and located below the recesses is removed. As a result, an etching resistive pattern 15 constituted by the component of the second phase is obtained as shown in FIG. 10 and the projections 19 of the imprinting resist layer is left on this pattern 15.

Then, using the etching resistive pattern 15 comprising the component of the second phase and the projections 19 of the imprinting resist layer 16 as masks, the substrate 11 is worked as shown in FIG. 11. Finally, the etching resistive pattern 15 is removed to form an imprint mold 30 as shown in FIG. 12.

Figure 22:
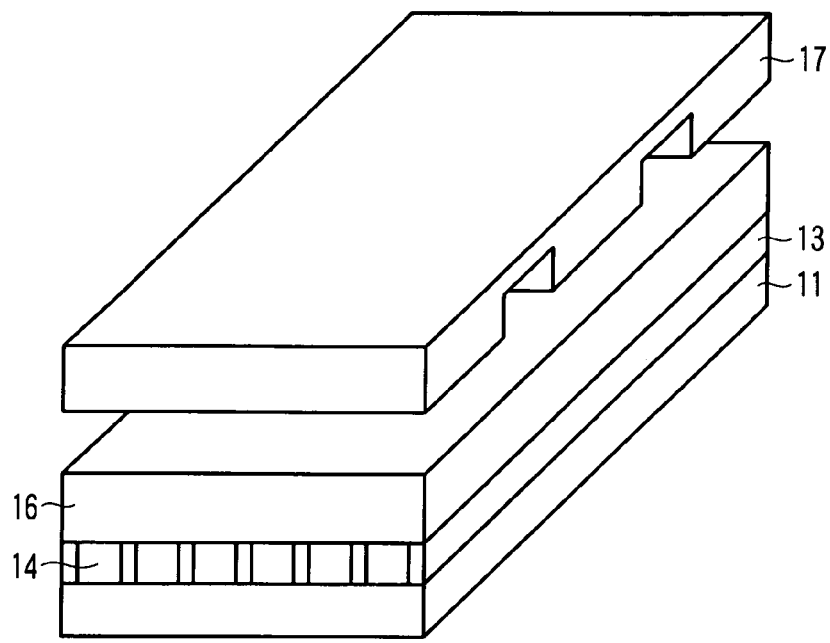
FIG. 22 is a perspective view representing the next step to the step shown in FIG. 21.
Figure 23:
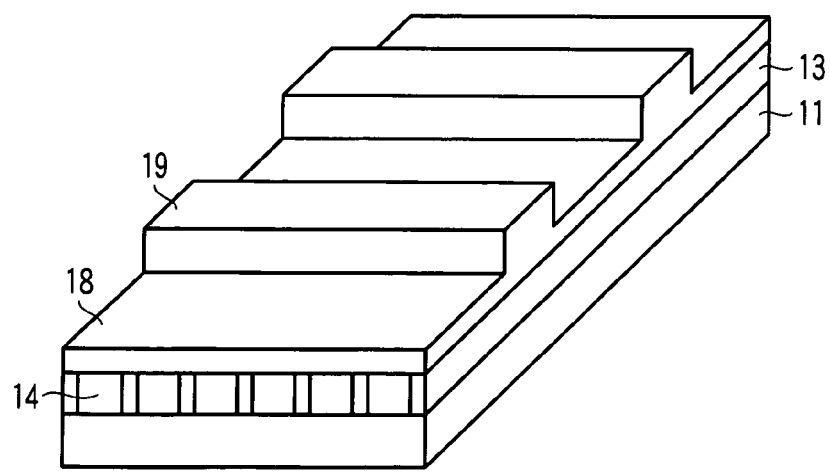
FIG. 23 is a perspective view representing the next step to the step shown in FIG. 22.

As shown in FIG. 21, the imprinting resist layer 16 may be placed on the diblock copolymer layer 13 that has been phase-separated due to the creation of lamellar easy-to-etch region 14. Then, using the mask pattern 17 as shown in FIG. 22, an uneven pattern consisting of projections 19 and recesses 18 is formed on the imprinting resist layer 16 as shown in FIG. 23.

The recesses 18 of the uneven pattern formed on the imprinting resist layer 16 are removed and then the easy-to-etch region 14 constituted by the component of the first phase and located below the recesses is removed. As a result, an etching resistive pattern 15 constituted by the component of the second phase is obtained as shown in FIG. 10 and the projections 19 of the imprinting resist layer is left on this pattern 15.

Then, using the etching resistive pattern 15 comprising the component of the second phase and the projections 19 of the imprinting resist layer 16 as masks, the substrate 11 is worked as shown in FIG. 11. Finally, the etching resistive pattern 15 is removed to form an imprint mold 30 as shown in FIG. 12.

The imprint mold to be manufactured by the method according to these embodiments can be suitably employed in the manufacture of a magnetic recording medium.

Next, a method of manufacturing a magnetic recording medium according to one embodiment will be explained with reference to FIGS. 24 to 29.

As shown in FIG. 24, a magnetic film 32 and an imprinting resist layer 33 are formed on the medium substrate 31 and then the imprint mold 30 that has been manufactured as described above is placed thereon. This magnetic film 32 may be formed by a sputtering method, for example. This imprinting resist layer 33 may be formed by a coating method, for example.

Using a pressing apparatus, etc., the imprint mold 30 is pressed as shown in FIG. 25 to form a projected pattern 34 on the imprinting resist layer 33 as shown in FIG. 26. On this occasion, for the purpose of enhancing the mold-releasing property, the imprint mold 30 may be subjected in advance to mold-releasing treatment using an alkyl fluoride silane coupling agent, perfluoropolyether derivatives or carbon film.

Figure 28:
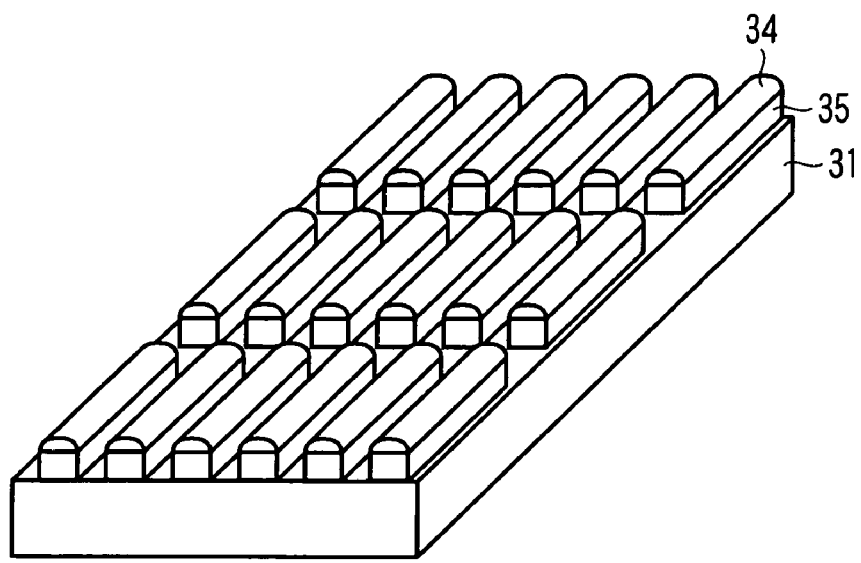
FIG. 28 is a perspective view representing the next step to the step shown in FIG. 27.

The residual resist left in the recesses is removed to expose the magnetic film 32 as shown in FIG. 27 and then the magnetic film 32 is worked by ion milling, etc. As a result, it is possible to obtain fine magnetic dots 35 which are isolated from each other as shown in FIG. 28. The resist pattern 34 deposited on the magnetic dots 35 may be removed as required as shown in FIG. 29.

Figure 29:
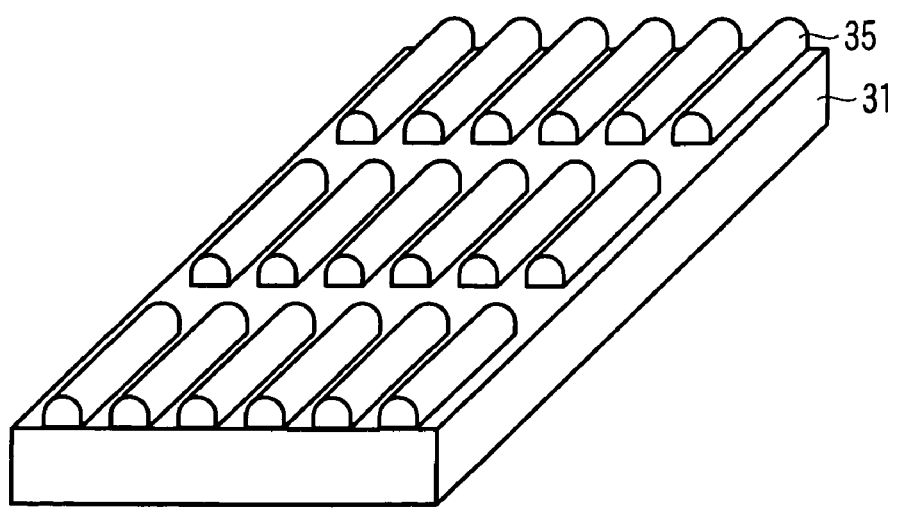
FIG. 29 is a perspective view representing the next step to the step shown in FIG. 28.

The recording cell formed of the magnetic dot thus formed may be shaped into a rod-like configuration differing in ratio of size between the length and the width thereof as shown in FIG. 29. As described above, it is difficult to form a nano-pattern of a rod-like configuration even if the nano-pattern is to be formed by simply taking advantage of the phase separation of a diblock copolymer. However, according to the embodiment, it is now possible to design an optimal pattern with a high degree of freedom.

Incidentally, this method can be applied not only to the magnetic recording medium but also to the technical fields which require the formation of a fine pattern, such as optical discs and semiconductor devices.

Following are examples of the present invention, which are not intended to indicate that the present invention is limited to these examples.

The following compositions "A", "B", "C" and "D" are examples of the solution for forming a self-organized pattern, which were employed in the following Examples. It should be appreciated that the solution for forming a self-organized pattern is not limited to these compositions.

(A) Using polystyrene-polyethylene oxide (Mn:Ps=3000, PEO=3000) and SOG (Tokyo Ohka OCD T-7), a coating solution was prepared. Namely, these components were mixed together in such a manner that the weight of solid matter of OCD T-7 became 3.2 times as large as that of PEO and the resultant mixture was adjusted with a diethylene glycol dimethyl ether solvent in such a manner that a total quantity of solid matter in the coating solution became 1.5%.

(B) Using polystyrene-polyethylene oxide (Mn:Ps=3000, PEO=3000) and SOG (Tokyo Ohka OCD T-7), a coating solution was prepared. Namely, these components were mixed together in such a manner that the weight of solid matter of OCD T-7 became 3.2 times as large as that of PEO, and the resultant mixture was adjusted with a triethylene glycol dimethyl ether solvent in such a manner that a total quantity of solid matter in the coating solution became 2.5%.

(C) Using polystyrene-polyethylene oxide (Mn:Ps=19000, PEO=6400) and SOG (Tokyo Ohka OCD T-7), a coating solution was prepared. Namely, these components were mixed together in such a manner that the weight of solid matter of OCD T-7 became 3.8 times as high as that of PEO and the resultant mixture was adjusted with a triethylene glycol dimethyl ether solvent in such a manner that a total quantity of solid matter in the coating solution became 2.5%.

(D) Using polystyrene-polyethylene oxide (Mn:Ps=3000, PEO=3000) and SOG (Tokyo Ohka OCD T-7), a coating solution was prepared. Namely, these components were mixed together in such a manner that the weight of solid matter of OCD T-7 became twice as large as that of PEO and the resultant mixture was adjusted with a triethylene glycol dimethyl ether solvent in such a manner that a total quantity of solid matter in the coating solution became 2.5%.

EXAMPLE 1

First of all, hydrogen silsesquioxane (HSQ) was drawn by electron beam on a 3-inch substrate, thereby forming a pair of guides 20 (300 nm in width and 10 nm in height), thus preparing a substrate 11 as shown in FIG. 4.

Then, the aforementioned solution "A" was spin-coated on the substrate 11 having the guides 20 to form a diblock copolymer layer 12 as shown in FIG. 5. The diblock copolymer layer 12 was then subjected to annealing for 3 hours at a temperature of 200° C. to form an easy-to-etch region 14 constituted by cylinders each constituted by PS, thereby obtaining a phase-separated diblock copolymer layer 13. The pitch of these cylinders that were created by the phase separation was 16 nm.

On this phase-separated diblock copolymer layer 13 was deposited a novolac type i-line resist layer as an imprinting resist layer 16, as shown in FIG. 19. A mask pattern 17 made of nickel and having projected lines each having a width of 60 nm and a height of 50 nm and aligned at a pitch of 150 nm was prepared and placed on the imprinting resist layer 16 as shown in FIG. 20. This mask pattern 17 was set on a pressing apparatus in such a manner that the lines of the mask pattern 17 were intersected with the longitudinal direction of the easy-to-etch region 14 at an angle of 90°.

Then, the mask pattern 17 was pressed at a pressure of 2000 bar. for 60 seconds to perform imprinting, thereby forming an imprinting resist layer 16 wherein the pattern formed thereon was constituted by the recesses 18 and the projections 19 as shown in FIG. 20.

By oxygen dry etching, the recesses 18 of the imprinting resist layer was removed and, at the same time, a portion of the easy-to-etch region 14 which was located below the recesses 18 was removed. As a result, it was possible to obtain a grid-like pattern consisting of the projections 19 of imprinting resist layer and the etching resistive pattern 15 as shown in FIG. 10. Then, with this grid-like pattern being employed as a mask, etching of the silicon substrate was performed using $SF_6$ gas to create trenches 21 in the substrate 11 as shown in FIG. 11.

Thereafter, the resultant substrate was subjected to oxygen etching and washing with dilute hydrofluoric acid to remove the etching resistive pattern 15. As a result, it was possible to confirm the creation of trenches 21 with a 16 nm-pitch×150 nm-pitch on the silicon substrate 11. This silicon substrate was found capable of being employed as an imprint mold.

EXAMPLE 2

In the same manner as explained in Example 1, a substrate 11 having a pair of guides 20 was prepared. Then, the aforementioned solution "A" was spin-coated on the substrate 11 to form a diblock copolymer layer 12 as shown in FIG. 5. The diblock copolymer layer 12 was then subjected to annealing for 3 hours at a temperature of 200° C. to form an easy-to-etch region 14 constituted by cylinders each constituted by PS, thereby obtaining a phase-separated diblock copolymer layer 13. The pitch of these cylinders that were created by the phase separation was 16 nm.

Then, the phase-separated diblock copolymer layer 13 was subjected to oxygen etching to remove the easy-to-etch region 14 constituted by PS from the phase-separated diblock copolymer layer 13, thereby obtaining an etching resistive pattern 15 as shown in FIG. 7. This etching resistive pattern 15 was formed of a mixed phase consisting of PEO and SOG.

On this etching resistive pattern 15 was deposited a novolac type i-line resist layer as an imprinting resist layer 16, as shown in FIG. 8. A mask pattern 17 made of nickel and having projected lines each having a width of 60 nm and a height of 50 nm and aligned at a pitch of 150 nm was prepared and placed on the imprinting resist layer 16 as shown in FIG. 8. This mask pattern 17 was set on a pressing apparatus in such a manner that the lines of the mask pattern 17 were intersected with the longitudinal direction of the easy-to-etch region 14 at an angle of 90°.

Then, the mask pattern 17 was pressed at a pressure of 2000 bar. for 60 seconds to perform imprinting, thereby forming an imprinting resist layer 16 wherein the pattern formed thereon was constituted by the recesses 18 and the projections 19 as shown in FIG. 9.

By oxygen dry etching, the recesses 18 of the imprinting resist layer was removed to obtain a grid-like pattern consisting of the projections 19 of the imprinting resist layer and the etching resistive pattern 15 as shown in FIG. 10. Then, with this grid-like pattern being employed as a mask, etching of the silicon substrate was performed using $SF_6$ gas to create trenches 21 in the substrate 11 as shown in FIG. 11.

Thereafter, the resultant substrate was subjected to oxygen etching and washing with dilute hydrofluoric acid to remove the etching resistive pattern 15. As a result, it was possible to confirm the creation of trenches 21 with a 16 nm-pitch×150 nm-pitch on the silicon substrate 11. This silicon substrate was found capable of being employed as an imprint mold.

EXAMPLE 3

The procedures of Example 2 were repeated in the same manner except that the coating solution "B" was substituted for the coating solution "A", thereby forming a pattern on the substrate 11. As a result, it was possible to confirm the creation of trenches 21 with a 16 nm-pitch×150 nm-pitch on the silicon substrate 11. This silicon substrate was found capable of being employed as an imprint mold.

EXAMPLE 4

The procedures of Example 2 were repeated in the same manner except that the coating solution "C" was substituted for the coating solution "A", thereby forming a pattern on the substrate 11. As a result, it was possible to confirm the creation of trenches 21 with a 38 nm-pitch×150 nm-pitch on the silicon substrate 11. This silicon substrate was found capable of being employed as an imprint mold.

EXAMPLE 5

The procedures of Example 2 were repeated in the same manner except that the coating solution "D" was substituted for the coating solution "A", thereby forming a pattern on the substrate 11. As a result, it was possible to confirm the creation of trenches 21 with a 20 nm-pitch×150 nm-pitch on the silicon substrate 11. This silicon substrate was found capable of being employed as an imprint mold.

EXAMPLE 6

Using the imprint mold obtained in Example 1, a magnetic film was worked to manufacture a magnetic recording medium.

First of all, as shown in FIG. 24, a magnetic film 32 having a thickness of 20 nm was formed on a glass substrate 31 and then a novolac type resist was spin-coated on the magnetic film 32 to form a resist layer 33 having a thickness of 30 nm.

The imprint mold 30 having a grid-like pattern and manufactured in Example 1 was placed on the resist layer 33 and the resist layer 33 was pressed at a pressure of 2000 bar. for 60 seconds by a pressing apparatus to perform imprinting as shown in FIG. 25. In this case, the surface of imprint mold 30 was subjected in advance to a mold-releasing treatment comprising the steps of dipping it in a 2% ethanol solution of a coupling agent (TSL8233; available from Toshiba Silicone Co., Ltd.) and drying it for one hour in an oven heated to 120° C.

As a result, trenches of a grid-like pattern were formed on the resist layer 33, thereby obtaining a resist pattern 34 as shown in FIG. 26. Portions of the resist layer which were left remaining on the bottom of trenches were removed by oxygen plasma to allow the magnetic film 32 to be exposed, as shown in FIG. 27. Thereafter, with the resist pattern 34 being used as a mask, the magnetic film 32 was etched away by Ar ion milling to obtain a magnetic film pattern 35 as shown in FIG. 28.

Finally, the resist pattern 34 was removed to manufacture a magnetic recording medium provided with magnetic cells consisting of the magnetic film pattern 35 as shown in FIG. 29. The dimensions of each of magnetic cells were 16 nm-pitch×150 nm-pitch, thus confirming the transcription of the pattern of the imprint mold.

According to the present invention, it is possible to provide a pattern forming method which is excellent in degree of freedom, thus enabling a pattern such as the width of track to be designed optimally depending on the configuration of recording head, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a layer comprising a composition above a substrate, the composition containing a diblock copolymer which can be phase-separated into a first phase and a second phase exhibiting higher etching resistance than the first phase, the first phase containing a first component and the second phase containing a second component;
    subjecting the diblock copolymer to phase separation to obtain a phase-separated layer, thereby forming an easy-to-etch region constituted by the first component and having a cylindrical or lamellar configuration extending in a first direction;
    forming an imprinting resist layer on the phase-separated layer;
    subjecting the imprinting resist layer to imprinting work using a mask pattern to form, on the imprinting resist layer, an uneven pattern extending in a second direction intersecting with the first direction and including projections and recesses;
    selectively removing, from the imprinting resist layer, the resist left remaining on a bottom of each of the recesses of the uneven pattern, thereby leaving only the resist constituting the projections and, at the same time, selectively removing the first component from the phase-separated layer to obtain an etching resistive pattern containing the second component; and
    etching the substrate using, as a mask, not only the projections of the imprinting resist layer but also the etching resistive pattern containing the second component.

2. The method according to claim 1, further comprising forming a guide above the substrate prior to forming the layer above the substrate, and wherein the first direction is a direction extending parallel to the guide.

3. The method according to claim 1, wherein the diblock copolymer comprises a polymer selected from the group consisting of polystyrene and polyacrylate.

4. The method according to claim 1, wherein the diblock copolymer comprises a polymer selected from the group consisting of polymethylmethacrylate, poly(ethylene-alt-propylene), polybutadiene, polyisoprene, polyvinylmethyl ether, polyethylene oxide, polypropylene oxide and polybutylene oxide.

5. The method according to claim 1, wherein the composition containing the diblock copolymer contains a silicon compound as the second component.

6. The method according to claim 5, wherein the silicon compound is selected from the group consisting of silicates, hydrogen siloxane, methyl siloxane, hydrogen silsesquioxane and methyl silsesquioxane.

7. The method according to claim 1, further comprising removing the etching resistive pattern from the substrate.

8. The method according to claim 1, wherein removing the recesses of the imprinting resist layer is performed by oxygen dry etching 9. A pattern forming method comprising:
    forming a layer comprising a composition above a substrate, the composition containing a diblock copolymer which can be phase-separated into a first phase and a second phase exhibiting higher etching resistance than the first phase, the first phase containing a first component and the second phase containing a second component;
    subjecting the diblock copolymer to phase separation to obtain a phase-separated layer, thereby forming an easy-to-etch region constituted by the first component and having a cylindrical or lamellar configuration extending in a first direction;
    removing the first component from the phase-separated layer to form an etching resistive pattern extending in the first direction and containing the second component;
    forming a imprinting resist layer on the etching resistive pattern;
    subjecting the imprinting resist layer to imprinting work using a mask pattern to form, on the imprinting resist layer, an uneven pattern extending in a second direction intersecting with the first direction and including projections and recesses;
    selectively removing, from the imprinting resist layer, the resist left remaining on a bottom of each of the recesses of the uneven pattern, thereby leaving only the resist constituting the projections; and etching the substrate using, as a mask, not only the etching resistive pattern containing the second component but also the projections of the imprinting resist layer.

10. The method according to claim 9, further comprising forming a guide above the substrate prior to forming the layer above the substrate, and wherein the first direction is a direction extending along the length of the guide.

11. The method according to claim 9, wherein the diblock copolymer comprises a polymer selected from the group consisting of polystyrene and polyacrylate.

12. The method according to claim 9, wherein the diblock copolymer comprises a polymer selected from the group consisting of polymethylmethacrylate, poly(ethylene-alt-propylene), polybutadiene, polyisoprene, polyvinylmethyl ether, polyethylene oxide, polypropylene oxide and polybutylene oxide.

13. The method according to claim 9, wherein the composition containing the diblock copolymer contains a silicon compound as the second component.

14. The method according to claim 13, wherein the silicon compound is selected from the group consisting of silicates, hydrogen siloxane, methyl siloxane, hydrogen silsesquioxane and methyl silsesquioxane.

15. The method according to claim 9, further comprising removing the etching resistive pattern from the substrate.

16. The method according to claim 9, wherein removing the recesses of the imprinting resist layer is performed by oxygen dry etching.

* * * * *